United States Patent [19]

Higgins, III

[11] Patent Number: 5,468,995
[45] Date of Patent: Nov. 21, 1995

[54] SEMICONDUCTOR DEVICE HAVING COMPLIANT COLUMNAR ELECTRICAL CONNECTIONS

[75] Inventor: Leo M. Higgins, III, Austin, Tex.

[73] Assignee: Motorola, Inc., Schaumburg, Ill.

[21] Appl. No.: 270,548

[22] Filed: Jul. 5, 1994

[51] Int. Cl.$^6$ ................................................. H01L 23/50
[52] U.S. Cl. ........................................ 257/697; 257/778
[58] Field of Search ................................... 257/697, 741, 257/734, 778, 787, 692

[56] References Cited

U.S. PATENT DOCUMENTS

| | | | |
|---|---|---|---|
| 4,807,021 | 2/1989 | Okumura | 357/75 |
| 5,067,007 | 11/1991 | Kanji et al. | 357/74 |
| 5,235,741 | 8/1993 | Mase | 29/830 |
| 5,237,635 | 8/1993 | Lai | 385/101 |

FOREIGN PATENT DOCUMENTS

| | | |
|---|---|---|
| 1136357 | 5/1989 | Japan . |
| 2035764 | 2/1990 | Japan . |

OTHER PUBLICATIONS

IBM Technical Disclosure Bulletin; "Pressure Contact Type Chip Join Technique," Ward, vol. 18, No. 9, Feb. 1976.

Primary Examiner—Rolf Hille
Assistant Examiner—Roy Potter
Attorney, Agent, or Firm—Minh-Hien N. Clark

[57] ABSTRACT

An array type semiconductor device (10 and 40) has compliant polymer columnar I/O connections (30) to accommodate thermally induced stress during device operation. The device has a semiconductor die (22) mounted to a substrate (12) and electrically connected thereto. A package body (28, 46) covers the semiconductor die and electrical connections (26, 42) to provide mechanical protection. The I/O contacts are formed from a polymer core (34) that is metallized to impart electrical conductivity to the contacts. The metallization (36, 38) may either be a plating around the polymer core or fillers embedded in the polymer. The aspect ratio of the polymer contacts is greater than one to provide compliance while maintaining high I/O density in the array. The metallized polymer contacts may be attached to the package substrate and to a PWB with joints (32) composed of either solder or a conductive adhesive.

13 Claims, 3 Drawing Sheets

5,468,995

SEMICONDUCTOR DEVICE HAVING COMPLIANT COLUMNAR ELECTRICAL CONNECTIONS

FIELD OF THE INVENTION

The present invention relates in general to a semiconductor device, and more specifically to an array semiconductor device having compliant columnar electrical connections and a method for making the same.

BACKGROUND OF THE INVENTION

Most integrated circuit (IC) devices are packaged so as to locate the input/output (I/O) connections along the outer edges or perimeter of the device. These devices have metal leads which are mated to a printed wiring board (PWB) by insertion into plated through holes (PTH) or by placement of the leads on top of metal pads on the PWB surface. Electrical connection is made during subsequent soldering operations. Another common type of device has the I/O connections, in the form of pins, arrayed across the area of the package body instead of along the perimeter of the package. This type of package is generally known as a pin grid array (PGA). These metal pins are most commonly inserted into a grid of PTHs formed in the PWB. Less commonly, the ends of the PGA pins are placed in contact with metal pads arrayed across the surface of the PWB. Electrical connection is made during subsequent soldering operations. The method of electrically connecting device I/O leads or pins to solder pads on the surface of PWBs is referred to as surface mount technology (SMT), while the method of connecting using leads or pins inserted into PTHs is referred to a through hole assembly (THA).

The PGA has the advantage of achieving high I/O numbers, typically greater than 100, in a relatively small area while maintaining a fairly coarse I/O pin pitch of 0.100 inch. In contrast, a perimeter I/O device must have leads on much tighter pitches, typically less than 0.050 inch, in order to achieve an equivalent number of I/O interconnections as the PGA. The fine pitch used for a high I/O perimeter device is commonly 0.4 mm to 0.5 mm. It is difficult to achieve high yields and productivity with such fine pitch perimeter soldering.

However, while the PGA has advantages over perimeter I/O devices, one problem with the PGA package is the ease with which the I/O pins can be bent or damaged. Bent pins typically require a pin straightening step before the package can be used. However, more often than not, the pins are not repairable once bent, and thus an electrically functional IC must be scrapped.

Another type of device called a ball grid array (BGA) provides advantages in the areas of package size and the system PWB cost. BGA packages have I/O connections composed of solder balls which are joined to the package prior to PWB assembly. The solder balls are more resistant to mechanical damage during normal handling than either I/O leads or pins because the solder balls cannot be bent. They can, however, be flattened. If high melting temperature solder balls, such as 90% lead /10% tin solder, are used in the BGA, these solder balls do not melt during PWB solder reflow so as to maintain a relatively high standoff. A solder ball which has suffered some mechanical damage or flattening from handling, however, may not make electrical contact to the system board during the joining operation, thus resulting in an open circuit. Another problem facing the BGA package is the relatively low thermomechanical stress compliance afforded by the small diameter balls. The BGA I/O ball pitch of 1 mm to 1.5 mm restricts the ball diameter to an approximate range of 0.4 mm 1.0 mm since larger solder balls could result in short circuits between the balls. The separation distance between the BGA substrate and the PWB can be from 0.3 mm to 1.0 mm for these ball sizes. The short length of these solder joints are subjected to the thermal stresses which result from thermal expansion differences in the BGA substrate and the PWB during the device's operation. While it is more desirable to have higher solder joint standoffs to accommodate large differences in thermal expansion, the aforementioned limitations on ball sizes and pitches prevent such higher solder joint standoffs.

Another prior art device uses high temperature solder columns in place of solder balls to provide a higher standoff than is possible with solder balls having the same diameter as the solder columns. However, despite the advantages over solder balls, these solder columns still exhibit fatigue with temperature cycling of the devices due to the thermally induced stresses, and therefore eventually break.

DETAILED DESCRIPTION OF A PREFERRED EMBODIMENT

Figure 1:
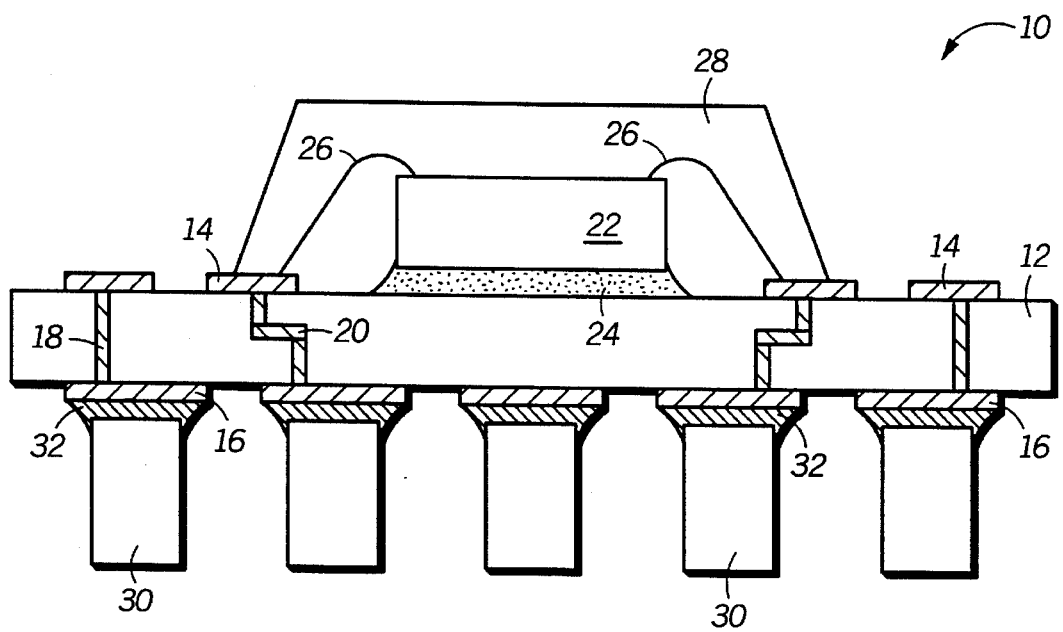
FIG. 1 illustrates, in cross-section, a semiconductor device having compliant columnar I/Os in an embodiment of the invention.

Embodiments of the present invention provide a high density I/O grid array package which allow a high level of thermal expansion mismatch between the package body and the PWB substrate to which it is joined. The high level of stress compliance afforded by the present invention also allows substantially larger grid array packages to be used than permitted with other forms of grid array packages, such as the PGAs or BGAs. Additionally, embodiments of the present invention are particularly suitable for use in multi-chip module packages with a size substantially larger than a typical high I/O single chip package.

Generically, a grid array semiconductor device, hereinafter referred to as a polymer column grid array (PCGA) is composed of a semiconductor die, a substrate, a package body, and a plurality of compliant conductive polymer contacts. The substrate has a die mounting area, a plurality of conductive traces, and a plurality of conductive lands connected to the conductive traces. The semiconductor die is mounted to the die mounting area and is electrically connected to the plurality of conductive traces. The package body covers the semiconductor die and a portion of the substrate. Each of the plurality of compliant conductive polymer contacts is composed of a polymeric core having a length and an outer metallic coating along the length of each core. The plurality of compliant conductive polymer contacts is connected to the plurality of conductive lands with a plurality of conductive joints to provide external electrical connections for the device.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated. Furthermore, the figures illustrate many of the same or substantially similar elements throughout the various views. Therefore, like or substantially similar elements will be labeled using the same or similar reference numerals.

In FIG. 1, a PCGA semiconductor device 10 is illustrated in cross-section in accordance with a first embodiment of the present invention. The device 10 has a substrate 12 which has a die mounting area, a plurality of conductive traces 14 on the top surface of the substrate, and a plurality of conductive lands 16 on the bottom surface of the substrate. The conductive lands 16 are electrically connected to the traces 14 by conductive vias 18 and 20 in the substrate. The substrate 12 itself may be a ceramic substrate or a polymeric substrate, such as a PWB material. Depending on the type of substrate used, the vias may be straight vias 18 in single layer substrates or they may be stacked vias 20 in multilayer substrates. A semiconductor die 22 is mounted in the die mounting area of the substrate 12. Typically, a conductive adhesive 24 is used for the attachment. Die attachment to a substrate is a well known process in the art. Semiconductor die 22 is electrically connected to the conductive traces 14 on the top surface of the substrate with a plurality of wire bonds 26. Wire bonding is also a well established process in the art.

Additionally, a package body 28 covers the semiconductor die 22 and the wire bonds 26 to provide mechanical protection to the die and wire bonds. The package body 28 is typically a molded encapsulant, such as an epoxy resin molding compound, although a cap or lid may also be used to provide the mechanical protection. Conventional transfer molding techniques may be used to form a molded package body, while a cap or lid may be attached to the substrate with some type of epoxy or glass seal. Also illustrated in FIG. 1 is a plurality of flexible or compliant columnar I/O contacts 30 attached to the plurality of conductive lands 16 with conductive joints 32. These columnar I/O contacts 30 provide external electrical connections for the device 10.

An important consideration in making the columnar I/O contacts 30 is its length. The aspect ratio of the column 30 should be greater than 1 in order to increase the compliance of the column while maintaining high package I/O density. Thus, the length of the columnar I/O contact 30 is greater than its diameter, readily allowing the contacts to deform with stress while maintaining the ability for the contacts to be spaced on a small pitch. This aspect ratio provides more compliance for the columns than the standard solder ball used on a BGA. The diameter of the columnar I/O contacts 30 should be substantially in range of 25 to 750 microns. Accordingly, the length of columnar contacts 30 should be greater than the diameter. One advantage to having the polymer I/O contacts is that they will not plastically bend so that no straightening of the contacts is required, thus eliminating the possibility of scrapping functional ICs due to bent pins.

Figures 2, 3:
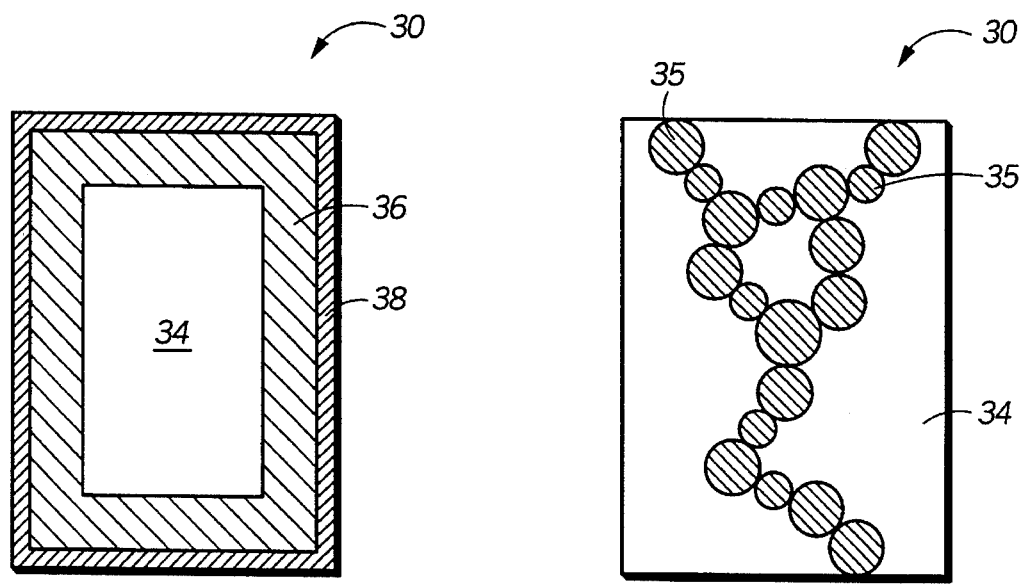
FIGS. 2 and 5 illustrate in finer detail several possible configurations for the compliant columnar I/O of the device of FIG. 1.

Illustrated in FIG. 2 is detailed cross-sectional view of a possible configuration for the flexible columnar I/O contacts 30 of the device of FIG. 1. The columnar I/O contact 30 is composed of a polymer fiber core 34, a first outer metallic coating 36, and a second outer metallic coating 38. The polymer core provides the I/O contacts with more compliance than either the rigid pins of PGAs or the small solder balls of BGAs. The polymer fiber core can be selected from a broad range of materials having a low modulus of elasticity to provide the necessary stress compliance. Additionally, the material should have a resistance to creep at typical system assembly and use temperatures, such as 225° C. and 40° C. to 100° C., respectively. Examples of possible materials include, but are in no way limited to, polyimides, polyphenylene sulfides, silicone elastomers, polytetrafluoroethylenes, fluorosilicones, fluorinated polymers, rubbers, high temperature rubbers such as Viton™, and epoxies. The polymer fiber core material should deform elastically during hot and cold temperature excursions, approximately −65° C. to 150° C., experienced by the electrical system, displaying little or no plastic deformation or creep.

As illustrated in FIG. 2, the polymer fiber core 34 is encased in outer metallic coatings 36 and 38. These metallic coatings are necessary to impart conductivity to the polymer fiber. While it is not necessary to have multiple metallic coatings in practicing the invention, it is preferable to do so for subsequent soldering operations in order to avoid complete dissolution of the metallic coatings and dewetting of the solder. Additionally, it is possible to have more than two metallic coatings on the polymer fiber core. Examples of possible metals for the metallic coatings include, but are not limited to, nickel, lead/tin solder, copper, and gold. These metals may be used in conjunction with each other to form the metallic coatings. For instance, the first metallic coating may be nickel and the second coating 38 may be lead/tin solder. Alternatively, the first and second metallic coatings may be nickel and copper, respectively. Other options include using nickel and gold or copper and gold for the first and second metallic coatings. If three metallic coatings were desired, it is possible to use nickel as the innermost coating, followed by copper and finally gold for the outermost metallic coating. A preferred thickness for each of the outer metallic coatings is approximately in a range of 0.1 to 5 microns. These metallic coatings may be applied to the polymer fiber core using either electrolytic or electroless plating methods. Alternatively, a metal vapor deposition technique may be utilized to form the metallic coatings. These three processes are well established in the art.

Figure 4:
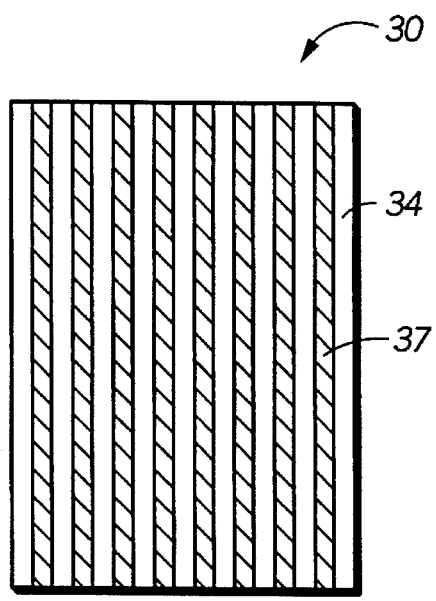

Other methods for making conductive polymer contacts are possible as illustrated in FIGS. 3–4. In one method, the polymer material 34''' itself is highly loaded with conductive metal particles 35, such as silver, or lead/tin solder as shown in FIG. 3. The particles should range in size from colloidal to granular particles, which translates to an approximate range of 0.01 microns to 100 microns with a preference to the lower end of the range. In this manner, no outer metallic coating may be necessary although it is possible to also metallize the outer surface in addition to filling the polymer material with the conductive particles.

Alternatively as illustrated in FIG. 4, metal filaments 37, such as copper, nickel, gold, and rhodium, tungsten, and molybdenum, are aligned substantially parallel to the major axis of the columnar contact 30''''. The filaments 37 should have a diameter approximately in a range of 2 microns to 50 microns. The volume around and between the wires is then filled with the desired polymer 34''''. The resulting polymer columnar contact 30'''' is illustrated in FIG. 4. In this case, the metal filaments act to stiffen the polymer element somewhat, while the elastic behavior of the polymer acts to prevent the wires from plastically deforming under stress. Metal filament reinforced columns may be made by pulling multiple strands of filaments through an impregnating bath of the desired polymer. Polymer curing or hardening would follow. In some cases, a circular mandrel could be used to form the round cross-section shape of the column. While not specifically illustrated, it is also possible to have the metal filaments braided, twisted, woven, or otherwise intertwined in the making of this type of conductive polymer contact.

The outer metallic coating 38 around the polymer fiber core 34 also serves another function besides imparting conductivity to the polymer fiber. The columnar I/O contact 30 must be attached to conductive lands 16 on the substrate 12 of the PCGA device 10 and also to pads (not shown) of the system PWB (not shown). The conductive joints 32 illustrate the attachment of the I/O columns 30 to the lands. These conductive joints 32 may be either solder or an organic conductive adhesive. In the case of a solder joint, the polymer core 34 material must be able to withstand a temperature substantially in a range of 200° C. to 230° for a time period of approximately 3 to 10 minutes, which are the temperatures and time periods for a typical solder reflow process. The metallic coating 38 around the polymer core 34 provides a solder-wettable surface which forms contact interfaces with solder with low contact resistance. The metal finishes previously mentioned provide this important characteristic to allow effective joining of the polymer I/O contacts 30 to the conductive lands 16. Additionally, the outer metallic coatings also allow the polymer I/O contacts 30 to be soldered to a PWB.

If the polymer I/O contacts are connected to the substrate 12 and/or the system PWB (not shown) through the use of conductive organic adhesives, the surfaces of the columns must be well wetted by the adhesive prior to adhesive cure. The surface of the polymer contact 30 may not require metallization if the contact resistance between the polymer contact and the conductive adhesive is not too high. However, the polymer contact 30 would still have to be made conductive, through the alternative methods discussed in conjunction with FIGS. 3 and 4. Additionally, the polymer core 34 material may need to withstand a temperature of approximately 120° C. to 150° C. for a time period of approximately 30 to 180 minutes, which are the temperatures and time periods for a typical epoxy adhesive cure cycle.

Figure 5:
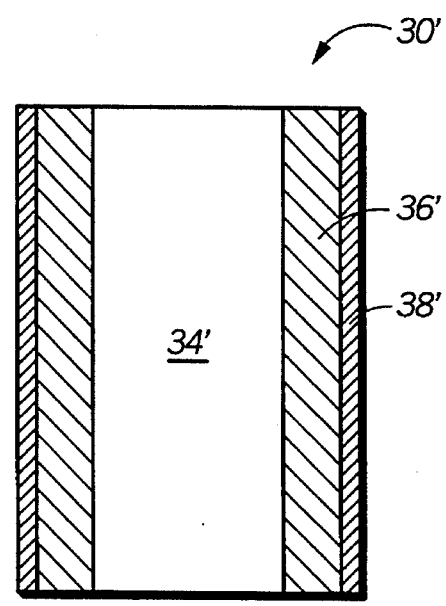

Illustrated in FIG. 5 is detailed cross-sectional view of another possible configuration for the flexible columnar I/O contacts of the device of FIG. 1. The columnar I/O contact 30' is still composed of a polymer fiber core 34', a first outer metallic coating 36', and a second outer metallic coating 38'. However, in this configuration, the polymer core 34' has been extruded into a long length of material and metallized in the long length form. After metallization, the metallized polymer fiber is then cut into the desired length. This method of making the conductive polymer contact 30' results in unplated areas where the cuts are made. This configuration of polymer contacts 30' is particularly suited if the contacts are attached to the conductive lands 16 on the substrate 12 and to the PWB (not shown) with a conductive adhesive. However, the unplated surfaces may not be desired if the contacts 30' are connected to the substrate 12 and to the PWB (not shown) with solder since solder will only wet up the sides of the columns. Depending upon the filler material used, if any, in the polymer core 34', it is possible that the solder will adhere to the unplated cross-section due to the wettability of the embedded particles.

Figure 6:
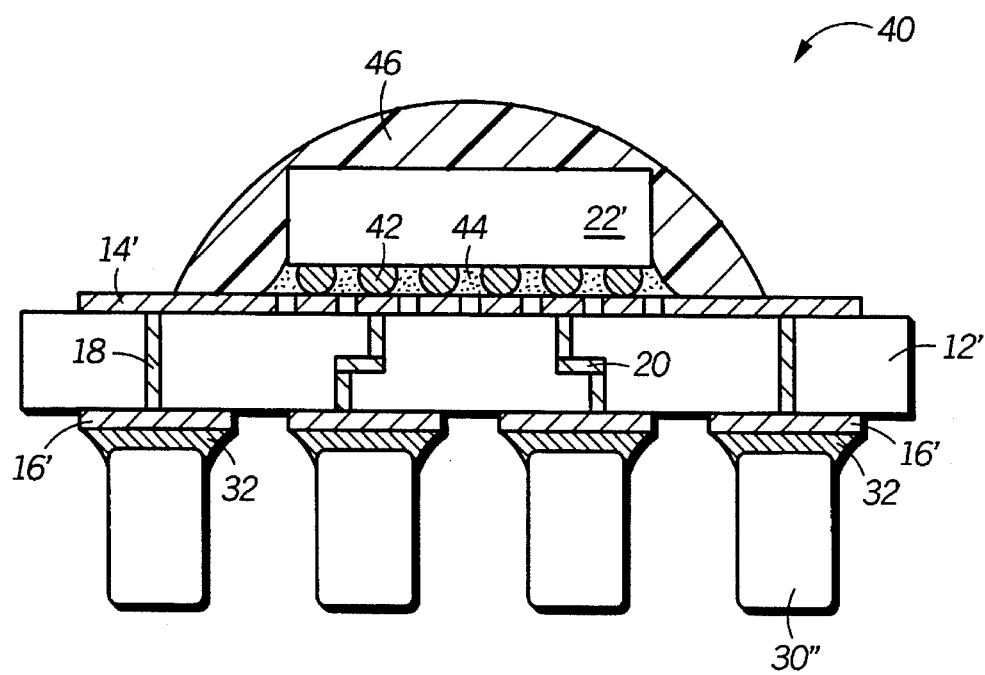
FIG. 6.illustrates in cross-section, a glob top semiconductor device having compliant columnar I/Os in another embodiment of the invention.

FIG. 6 illustrates, in cross-section, a PCGA semiconductor device 40 in another embodiment of the present invention. In this embodiment, the semiconductor die 22' is flip-chip bonded to the substrate 12' via flip-chip interconnect bumps 42. An underfill material 44 couples the die surface to the substrate and also provides a stress buffer for the die. Conventional flip-chip bonding methods may be used in practicing the invention. The die 22' is encapsulated with a glob-top 46 for mechanical protection. Possible glob-top materials include filled epoxies including acrylic modified epoxies and phenol epoxies. Other materials include silicone elastomers and gels.

Figure 7:
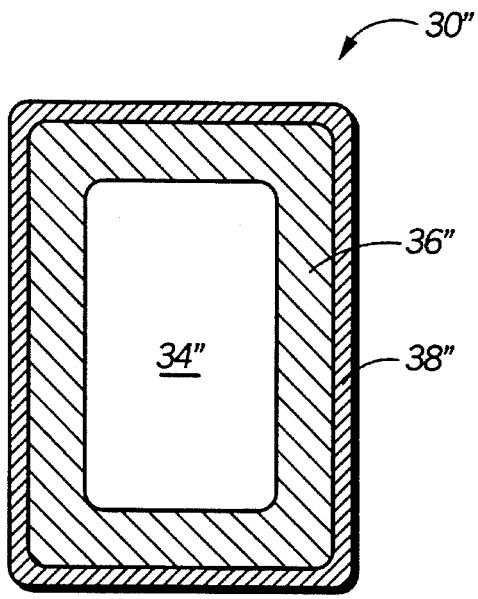
FIG. 7 illustrates in finer detail the compliant columnar I/O of the device of FIG. 4.
Figure 8:
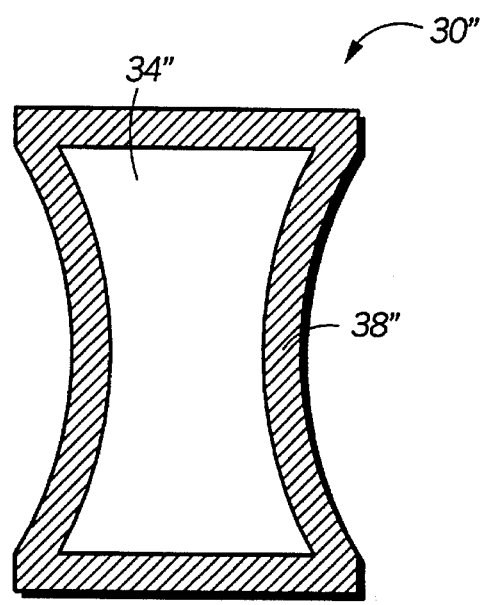
FIGS. 8–9 illustrate several other possible shapes for a compliant columnar I/O in accordance with the present invention.
Figure 9:
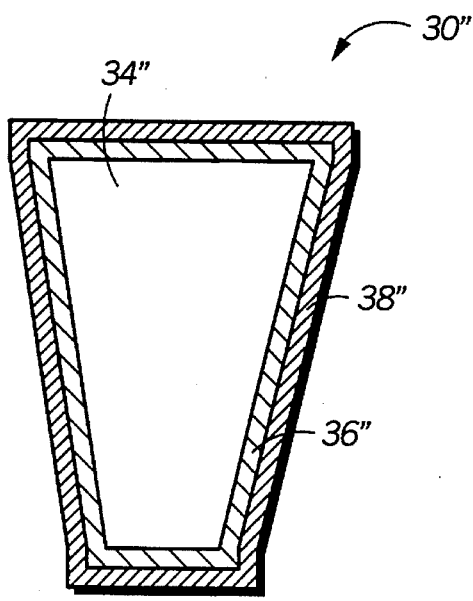

In this embodiment, the compliant polymer I/O contacts 30", as illustrated in FIG. 7, have beveled ends to reduce stress concentration points at the joints 32 and also at the board level joints (not shown). The polymer cores 34" may be molded to the desired shape, wherein the molding process provides the ability to form the beveled ends. Alternatively, the molding also allows the polymer cores to be cone-shaped or any other desired shape as illustrated in FIGS. 8–9. FIG. 8 depicts an hour-glass shaped contact 30'''. When bonded to a PCGA substrate and a system PWB, the region about the narrow waist of this contact would preferentially deform and accommodate the stress. This stress compliance in the center of the contact allows stress at the contact interfaces to the PCGA substrate and system PWB to be minimized. This hour-glass shaped contact may either have a sharply defined narrow waist center, or it may have a curved outer surface which gently tapers to the middle of the contact length to define the narrow waist region. FIG. 9 illustrates a cone shaped contact 30'''' which may be useful if it is desired to minimize the stress at the interface having the higher thermal expansion stress while allowing a higher level of stress at the interface having the lower thermal expansion stress. Both the hour-glass and the conic contacts allow a preferential localization of stress in the contacts and in the joints depending on user requirements. These individually formed polymer cores may be metallized using any of the aforementioned metallization techniques.

The foregoing description and illustrations contained herein demonstrate many of the advantages associated with the present invention. In particular, it has been revealed that greater thermal expansion stress compliance can be provided by the use of conductive polymer column contacts. Moreover, the greater compliance offered by the polymer contacts will allow the reliable use of larger packages which are mounted to a system PWB since the stress is proportional to the size of the package. Furthermore, since multichip modules are typically larger than single chip packages, the reliable assembly of large multichip modules will be enhanced through the use of the conductive polymer columnar contacts. Yet another advantage is that different embodiments of the present invention allow the interconnect stress to be localized in regions of the columnar contacts and isolated from critical electrical connection sites through the use of specially shaped columns.

Thus it is apparent that there has been provided, in accordance with the invention, a semiconductor device having compliant columnar electrical connections and a method for making the same that fully meet the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the various polymer contact shapes may be utilized in either of the embodiments illustrated. Moreover, the cross-sectional shape of the polymer columnar contact may be non-circular, such as octagonal or rectangular shape. In addition, the invention is not limited to any particular type or number of semiconductor devices. Therefore, it is intended that this invention encompass all such variations and modifications falling within the scope of the appended claims.

I claim:

1. A semiconductor device comprising:
   a semiconductor die;
   a substrate having a die mounting area, a plurality of conductive traces, and a plurality of conductive lands connected to the plurality of conductive traces, wherein the semiconductor die is mounted in the die mounting area;
   means for electrically connecting the semiconductor die to the plurality of conductive traces;
   a package body covering the semiconductor die and the means for electrically connecting the semiconductor die; and
   a plurality of elongated external electrical connections connected to the plurality of conductive lands by way of a plurality of conductive joints, wherein each elongated external electrical connection comprises an innermost polymeric core which has a length and a width, the length being greater than the width, and an outer metallic coating along the length of each innermost polymeric core.

2. The device of claim 1, wherein the means for electrically connecting the semiconductor die is selected from a group consisting of: a plurality of wire bonds and a plurality of flip-chip interconnect bumps.

3. The device of claim 1, wherein the innermost polymeric core of each elongated external electrical connection has a shape selected from a group consisting of: hour-glass, cylindrical, and conic.

4. The device of claim 1, wherein the innermost polymeric core of each elongated external electrical connection comprises a material selected from a group consisting of: polyimide, polyphenylene sulfide, silicone elastomer, polytetrafluoroethylene, fluorosilicone, fluorinated polymer, rubber, and epoxy.

5. The device of claim 1, wherein the outer metallic coating comprises a material selected from a group consisting of: gold, solder, nickel, and copper.

6. The device of claim 1, wherein the outer metallic coating has a thickness substantially in a range of 0.1 to 5 microns.

7. The device of claim 1, wherein the innermost polymeric core of of each elongated external electrical connection has a diameter substantially in range of 25 to 750 microns.

8. The device of claim 1, wherein the innermost polymeric core of each external electrical connection has a beveled end to minimize stress associated with sharp points.

9. A semiconductor device comprising:
   a semiconductor die;
   a substrate having a die mounting surface, a plurality of conductive traces, and a plurality of conductive lands connected to the plurality of conductive traces, wherein the semiconductor die is mounted on the die mounting surface of the substrate and is electrically connected to the plurality of conductive traces;
   a package body covering the semiconductor die; and
   a plurality of elongated external electrical connections connected to the plurality of conductive lands by way of a plurality of conductive joints, wherein each elongated external electrical connection comprises an innermost polymeric core which has a length and width, the length being greater than the width, a first outer metallic coating along the length of each innermost polymeric core, and a second outer metallic coating covering the first outer metallic coating.

10. The device of claim 9, wherein the innermost polymeric of each elongated external electrical connection is composed of a material able to withstand a temperature substantially in a range of 200° C. to 230° C. for a time period of approximately 3 to 10 minutes, and wherein the plurality of conductive joints is composed of a solder material.

11. The device of claim 9, wherein the innermost polymeric core of each elongated external electrical connection is composed of a material able to withstand a temperature of approximately 120° C. to 150° C. for a time period of approximately 30 to 180 minutes, and wherein the plurality of conductive joints is composed of a conductive adhesive.

12. The device of claim 9; wherein the innermost polymeric core of each elongated external electrical connection comprises a material selected from a group consisting of: polyimide, polyphenylene sulfide, silicone elastomer, fluorosilicone, epoxy, polytetrafluoroethylene, and fluorinated polymer; wherein the first outer metallic coating comprises a material selected from a group consisting of: nickel and copper; and wherein the second outer metallic coating comprises a material selected from a group consisting of: copper, gold, and solder.

13. The device of claim 12; wherein the innermost polymeric core of each elongated external electrical connection has a diameter substantially in a range of 25 to 750 microns; wherein the first outer metallic coating has thickness substantially in a range of 0.1 to 5 microns; and wherein the second outer metallic coating has thickness substantially in a range of 0.1 to 5 microns.

* * * * *